US011368776B1

(12) United States Patent
Woodruff et al.

(10) Patent No.: US 11,368,776 B1
(45) Date of Patent: Jun. 21, 2022

(54) AUDIO SIGNAL PROCESSING FOR SOUND COMPENSATION

(71) Applicant: Apple Inc., Cupertino, CA (US)

(72) Inventors: John Woodruff, Santa Cruz, CA (US); Jing Xia, San Jose, CA (US); Yacine Azmi, San Mateo, CA (US)

(73) Assignee: APPLE INC., Cupertino, CA (US)

( * ) Notice: Subject to any disclaimer, the term of this patent is extended or adjusted under 35 U.S.C. 154(b) by 49 days.

(21) Appl. No.: 16/875,584

(22) Filed: May 15, 2020

Related U.S. Application Data

(60) Provisional application No. 62/855,959, filed on Jun. 1, 2019.

(51) Int. Cl.
*H04R 1/10* (2006.01)
*H03G 3/30* (2006.01)
*G06F 3/16* (2006.01)

(52) U.S. Cl.
CPC ......... *H04R 1/1041* (2013.01); *H03G 3/3005* (2013.01); *G06F 3/162* (2013.01); *H03G 2201/508* (2013.01); *H04R 2430/01* (2013.01)

(58) Field of Classification Search
CPC ..... G10K 2210/1081; G10K 2210/108; G10K 11/1788; H04R 1/1083; H04R 1/1041; H04R 1/1016; H04R 5/033; H04R 5/04; H04R 2420/07; H04R 3/00; H04R 2430/01; H03G 9/02; H03G 9/025; H03G 5/04; H03G 5/165; H03G 3/001; H03G 3/002; H03G 3/00; H03G 3/32; H03G 3/3005; H03G 3/3089; H03G 1/0088; H03G 7/007; H03G 2201/508; H04H 60/04; G06F 3/162

USPC .......................... 381/74, 71.6, 102, 104, 107
See application file for complete search history.

(56) References Cited

U.S. PATENT DOCUMENTS

| | | | |
|---|---|---|---|
| 6,094,481 A * | 7/2000 | Deville | H04M 1/6033 381/104 |
| 10,602,275 B2 * | 3/2020 | Hui | H04R 25/505 |
| 2003/0064746 A1 * | 4/2003 | Rader | H04R 25/70 381/60 |
| 2005/0013443 A1 * | 1/2005 | Marumoto | H04N 21/4852 348/E5.103 |

(Continued)

FOREIGN PATENT DOCUMENTS

WO WO-2017036940 A1 * 3/2017 ......... G10L 21/0364

*Primary Examiner* — Ahmad F. Matar
*Assistant Examiner* — Sabrina Diaz
(74) *Attorney, Agent, or Firm* — Womble Bond Dickinson (US) LLP

(57) ABSTRACT

Signal energy in auditory sub-bands of an input audio signal is determined. Sound pressure level, SPL, in those sub-bands is then determined, based on the signal energy and based on sound output sensitivity of the against-the-ear audio device. In one instance, at least first and second gain lookup tables are determined based on a hearing profile of a user of the against-the-ear audio device. Sub-band gains that are to be applied to the input audio signal are determined based on the determined SPL. When the input audio signal is for example telephony the sub-band gains are computed using the first gain lookup table, and when the input audio signal is for example media the sub-band gains are computed using the second gain lookup table. Other aspects are also described and claimed.

21 Claims, 6 Drawing Sheets

(56) References Cited

U.S. PATENT DOCUMENTS

| | | | | |
|---|---|---|---|---|
| 2005/0015252 | A1* | 1/2005 | Marumoto | G10L 21/02 704/E21.002 |
| 2005/0260985 | A1* | 11/2005 | Rader | H04R 25/70 455/432.3 |
| 2010/0027807 | A1* | 2/2010 | Jeon | H04R 25/453 381/74 |
| 2012/0128187 | A1* | 5/2012 | Yamada | H04R 25/505 381/313 |
| 2017/0245065 | A1* | 8/2017 | Suhami | H04R 25/405 |
| 2017/0300289 | A1* | 10/2017 | Gattis | G06F 3/165 |
| 2018/0035216 | A1* | 2/2018 | Van Hasselt | A61B 5/128 |

* cited by examiner

AUDIO SIGNAL PROCESSING FOR SOUND COMPENSATION

This non-provisional patent application claims the benefit of the earlier filing date of U.S. provisional patent application No. 62/855,959 filed Jun. 1, 2019.

FIELD

An aspect of the disclosure here relates to digital audio signal processing techniques for controlling how sound is amplified and produced by an against-the-ear hearing device, such as a headphone or a mobile phone handset, in accordance with a hearing profile of the user of the device. Other aspects are also described.

BACKGROUND

Consumer electronic devices referred to as against-the-ear audio devices, such as headphones and mobile phone handsets, can be configured to personalize how they reproduce audio media (playback signals such as music and phone calls) to enhance the listening experience of their respective users. Individuals with hearing impairment require more sound pressure level, SPL, to reach the same perceived loudness as an individual with normal hearing. The amount of amplification applied by the against-the-ear audio device depends on the hearing profile of the respective user, sound output sensitivity of the against-the-ear audio device, and the input audio signal level (all of which vary as a function of frequency).

SUMMARY

An aspect of the disclosure here relates to a digital audio signal processing architecture in an audio system, for enhancing how different playback signals, such as media (e.g., music, movies) and telephony (e.g., the voice of a far end user in a phone call) are reproduced as sound, in a manner personalized for the user of an against-the-ear audio device. The against-the-ear audio device may for example be a smartphone or a headphone, and it has one more speakers that convert a digitally processed version of an input audio signal into sound (at the user's ear.) The input audio signal is a playback signal that may be media (e.g., music, sound track of a movie, a podcast, or a voice response from a virtual assistant), telephony (e.g., voice of a far end user during a phone call that may be a voice call or a video call service), or the voice of a talker (not the user) that has been picked up by one or more microphones of a smartphone of the user and is being relayed by the smartphone to the speaker of the against the ear audio device. The digital processing amplifies the playback signal in an operation also referred to here as multiband upward compression, in accordance with hearing loss compensation, HLC, gains. The amplified playback signal is converted into sound by the against-the-ear audio device, resulting in a personalized playback sound enhancement that works well in, telephony, media and other playback situations.

The HLC gains are computed based on i) a lookup table determined based on a stored hearing profile of the user, and ii) an estimated in-ear sound pressure level, SPL, of the playback signal. The digital processing as described below in more detail assumes that the hearing profile of the user is available. A hearing profile defines the hearing needs and preferences of the user including hearing level or hearing loss, as dB HL, across various frequencies of interest within the range of normal human hearing (also referred to here as auditory sub-bands.) The hearing profile may additionally specify quiet, comfortable and loud listening levels, frequency-dependent amplification preferences across different types of audio content (e.g., voice phone call, podcast, music, movies) or the user's sensitivity to noise or sound processing artifacts. The hearing profile may be derived from for example a stored audiogram of the user and may include outcomes of other standard hearing evaluation procedures such as Speech-in-Noise testing or measurement of otoacoustic emissions. In addition, or as an alternative to objective hearing evaluations such as the audiogram, the hearing profile may be the result of a process that generates acoustic stimuli using the speakers in the against-the-ear audio device and monitors or evaluates the user's responses to those acoustic stimuli (e.g., as verbal responses that have been picked up by a microphone of the audio device, or as manual responses entered by the user through a graphical user interface of the audio system.) The hearing profile may thus define the hearing preference or hearing sensitivity of the user, for example in terms of hearing level in dB (dB HL).

Another aspect described here is a way to avoid clipping (when level-dependent and frequency-dependent gains have been applied to the playback signal based on expected in-ear sound pressure level.) Full-scale playback signals may be clipped if amplified prior to the digital audio communications link codec processing (when transmitting the playback signal from an audio source device to an against-the-ear device.)

The above summary does not include an exhaustive list of all aspects of the present disclosure. It is contemplated that the disclosure includes all systems and methods that can be practiced from all suitable combinations of the various aspects summarized above, as well as those disclosed in the Detailed Description below and particularly pointed out in the Claims section. Such combinations may have particular advantages not specifically recited in the above summary.

BRIEF DESCRIPTION OF THE DRAWINGS

Several aspects of the disclosure here are illustrated by way of example and not by way of limitation in the figures of the accompanying drawings in which like references indicate similar elements. It should be noted that references to "an" or "one" aspect in this disclosure are not necessarily to the same aspect, and they mean at least one. Also, in the interest of conciseness and reducing the total number of figures, a given figure may be used to illustrate the features of more than one aspect of the disclosure, and not all elements in the figure may be required for a given aspect.

DETAILED DESCRIPTION

Several aspects of the disclosure with reference to the appended drawings are now explained. Whenever the shapes, relative positions and other aspects of the parts described are not explicitly defined, the scope of the invention is not limited only to the parts shown, which are meant merely for the purpose of illustration. Also, while numerous details are set forth, it is understood that some aspects of the disclosure may be practiced without these details. In other instances, well-known circuits, structures, and techniques have not been shown in detail so as not to obscure the understanding of this description.

Figure 1:
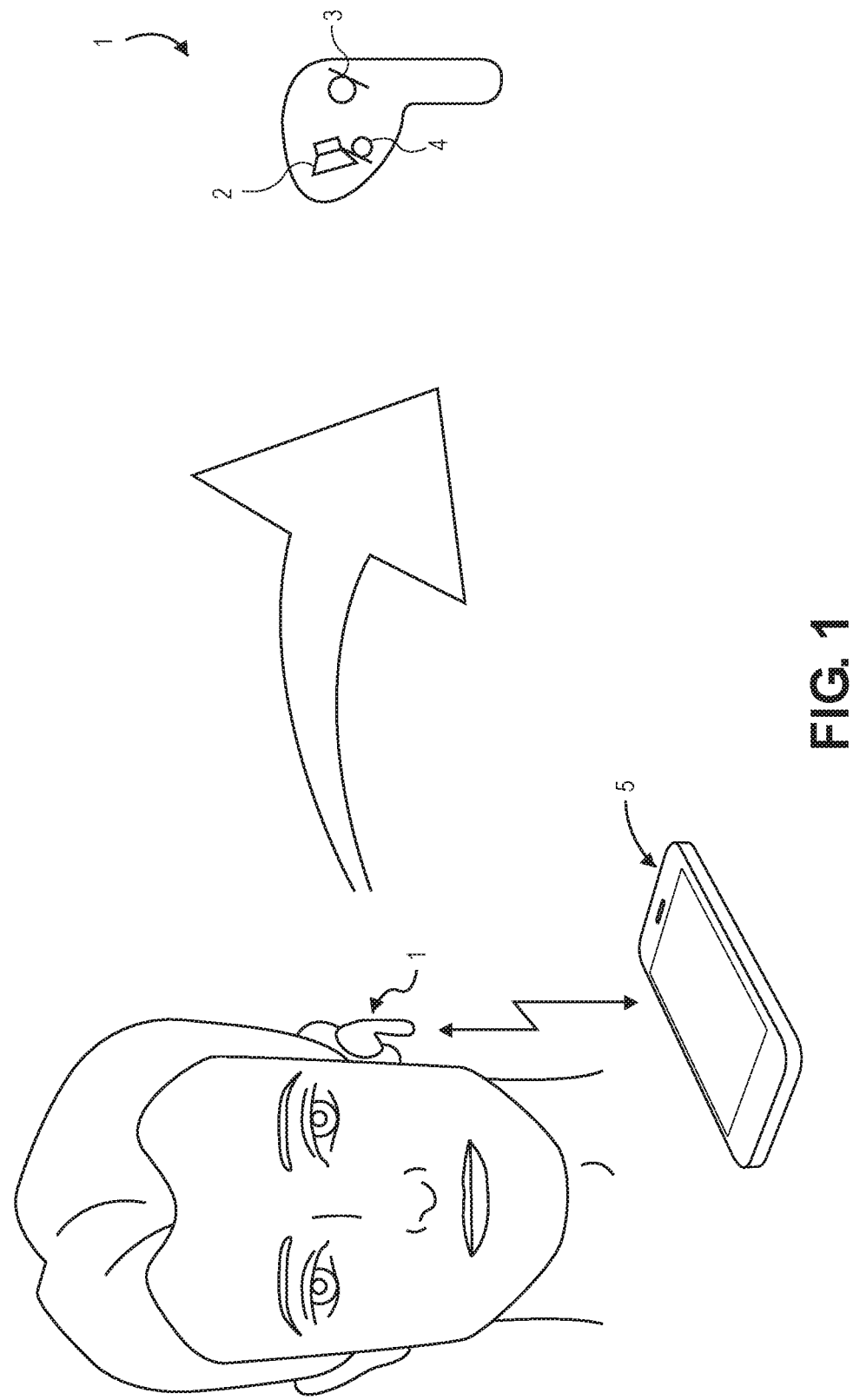
FIG. 1 shows an example against-the-ear audio device.

FIG. 1 shows an example of an against-the-ear audio device 1 that is part of an audio system in which an audio signal processing method for sound enhancement can be implemented. The against-the-ear audio device 1 shown is an in-ear earbud (in-ear headphone which may be a sealing-type that has a rubber ear tip, or a non-sealing or loose fitting type), which may be one of two headphones (left and right) that make up a headset. The methods described below can be implemented for one or both of the headphones that make up a headset. Alternatives (not shown) to the in-ear earbud include an on-the-ear headphone, an over-the-ear headphone, and a mobile phone handset. The against-the-ear audio device 1 is shown in use, by its user (who may also be referred to as a listener or a wearer.) The against-the-ear audio device 1 has an against-the-ear acoustic transducer or speaker 2 (arranged and configured to reproduce sound directly into an ear of a user), and may also have an external microphone 3 (arranged and configured to receive ambient sound directly) and an internal microphone 4 (arranged and configured to directly receive the sound reproduced by the speaker 2.) The microphones may not be necessary for the method described below, if the input audio signal that is being processed for sound enhancement is a playback signal such as media (e.g., music, sound track of a movie, a podcast, or a voice response from a virtual assistant), telephony (e.g., voice of a far end user during a phone call which may be a voice call or a video calling service), or the voice of another talker picked up by a microphone of a smartphone and then sent to the against-the-ear audio device 1.

Figure 4:
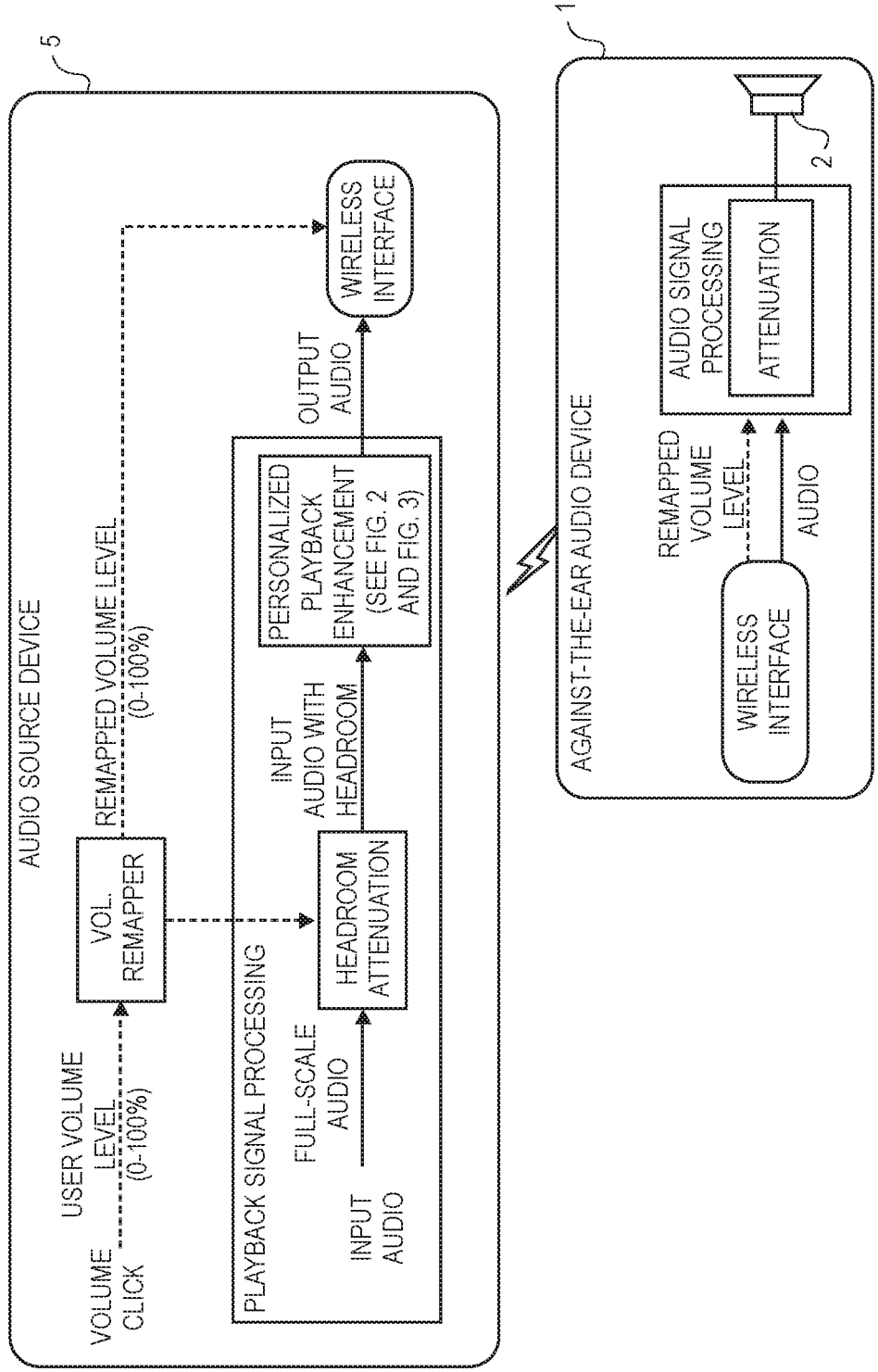
FIG. 4 is a block diagram of an audio system in which clipping is avoided when transmitting for example a full scale playback signal that has been enhanced according to the hearing profile of the user, to an against-the-ear audio device over a digital audio communications link.

The methods described below for processing an input audio signal are performed by various electronic hardware components all of which may be integrated in a housing of the audio source device 5 or in a housing of the against-the-ear device 1. A wired or wireless communication interface for receiving the input audio signal (e.g., a streaming media signal from a remote server), and the electronics that process the input audio signal and produce the output audio (e.g., as a transducer signal that drives the speaker 2), can be placed in the same housing. The electronics may include an audio amplifier to drive the speaker 2 with the input audio signal, a microphone sensing circuit or amplifier that receives the microphone signals converts them into a desired format for digital signal processing, and a digital processor and associated memory, where the memory stores instructions for configuring the processor (e.g., instructions to be executed by the processor) to perform the digital signal processing tasks discussed below in more detail. Note it is possible that some or essentially all of this electronics resides in another device, separate from the against-the-ear device 1. For instance, in the case of the against-ear-device 1 being a left headphone or right headphone, the headphone may be connected to an audio source device 5, shown in FIG. 1 as a smartphone, via a wired connection (in which case there may be no need for a power source in the headphone housing) or via a wireless connection (e.g., a BLUETOOTH link.) In both cases, much of the processing described below may be performed by a programmed processor in the audio source device 5, before transmitting the processed input audio signal to the headphone where it drives the speaker 2—see FIG. 4 for example.

Figure 2:
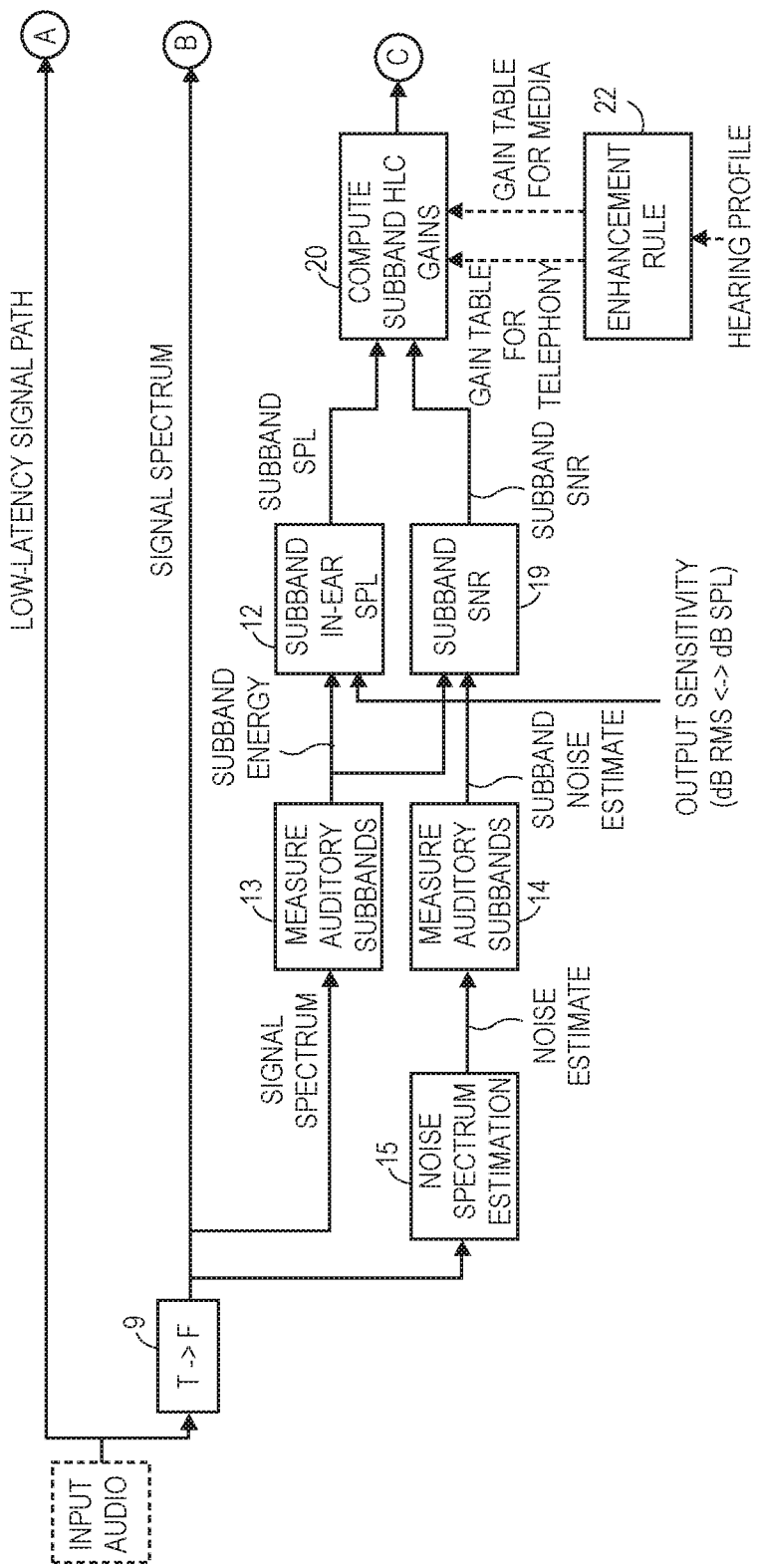
FIG. 2 is a block diagram of an audio signal processing architecture for sound enhancement by an against the ear audio device.

There are many users that, while wearing an against-the-ear device 1, have a preference or need for hearing at a higher sound pressure level, SPL, than would the average person. To meet the hearing preference or need of such a user, the audio system amplifies the input audio signal in accordance with a hearing profile of the user (stored in memory), before reproducing sound through the speaker 2. FIG. 2 is a block diagram of an example audio signal processing system or method that produces such sound enhancement. A time to frequency transform 9 such as a short time Fourier transform, STFT, or other suitable transform, converts sequential frames of the input audio signal into sub-band or frequency domain, FD (e.g., each frame may be 1 msec-10 msec). This is also referred to here as a signal spectrum, as a sequence of frames each containing a number of frequency bins or sub-bands or frequency components. The signal spectrum may span essentially the entire human audio range, for example 20 Hz-20 kHz, but certain auditory sub-bands may be selected from this range for analysis and enhancement as described below.

The process determines signal energy (where the term is used generically here to refer to strength of the signal spectrum in a particular sub-band) in each of several selected auditory sub-bands of the input audio signal. In one aspect, the sub-band gains include at least one sub-band below 500 Hz, and preferably at least one below 250 Hz, and at least one sub-band above 8 kHz. The process that computes an energy value for each sub-band, for example in units of decibels, dB, is indicated by the block referred to as measure auditory sub-bands 13. Next, an estimate of the sound pressure level, SPL, in the ear is computed for each sub-band, based on the signal energy in that sub-band and based on sound output sensitivity of the against-the-ear audio device 1 in that sub-band. The output sensitivity may be given for example as dB RMS level input to dB in-ear SPL output, which is a relationship that can be pre-determined in the laboratory for a given design of the against-the-ear audio device 1 and a population of typical ear shapes and geometries.

Continuing with FIG. 2, the process treats different types of input audio signals differently, for sound enhancement. In one aspect, telephony, such as voice of a far end user in a phone call, and media, such as music or a movie soundtrack, are treated differently. More specifically, a first gain lookup table is determined that is to be used (for sound enhancement) when the input audio signal is telephony, and a different, second gain lookup table is determined for media. More generally, there can be N gain tables for N different types of audio content, that are in the input audio signal, where N is two or more. For example, there may be a gain table for music, another gain table for movies, and yet another for remote pickup of a talker's voice. These gain tables are specific to the user of the against-the-ear audio device 1, and are computed based on a hearing profile of the user. Each gain lookup table outputs a gain value (positive dB) that is to be applied to a particular sub-band of the input audio signal, as a function of in-ear SPL in that sub-band.

Figure 5:
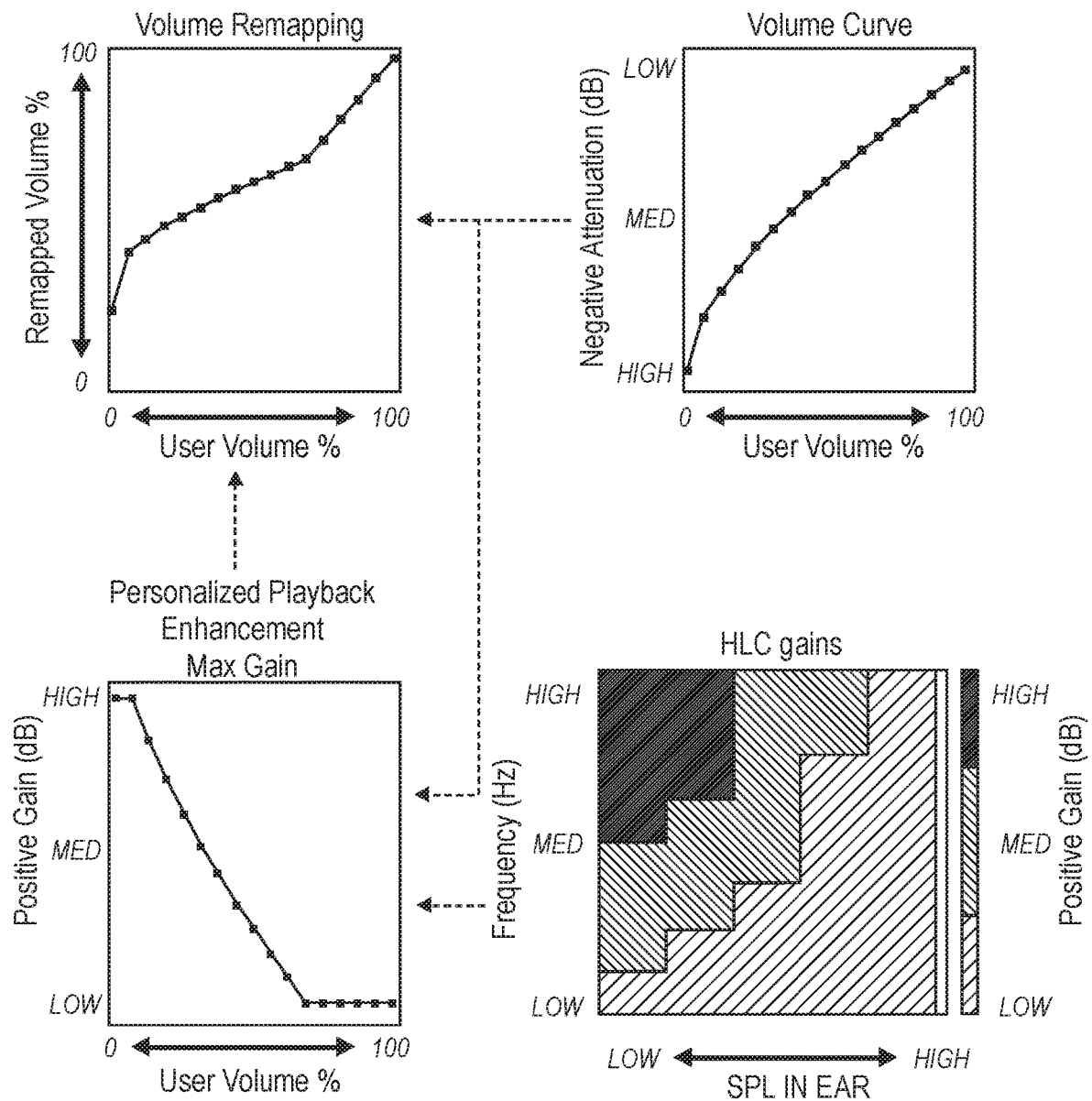
FIG. 5 illustrates an example sub-band gain lookup table, and a personalized playback enhancement max gain plot, a volume remapping plot, and a volume curve plot that may be used in the clipping avoidance aspects.

The gain table may also be referred to here as a multiband compression table. FIG. 5 shows an example of such a table, labeled hearing loss compensation, HLC, gains. In it, the gains are highest for medium to high frequencies at low SPL values, and they are lowest at the low frequencies and also at high SPL values. Note that the example shown here has three levels of gains, but this simplification is just to illustrate the concept—in practice, there are more than three levels of gains. Similarly, the granularity in SPL and in the sub-bands is expected to be greater than three level ranges or three frequency ranges.

Figure 6:
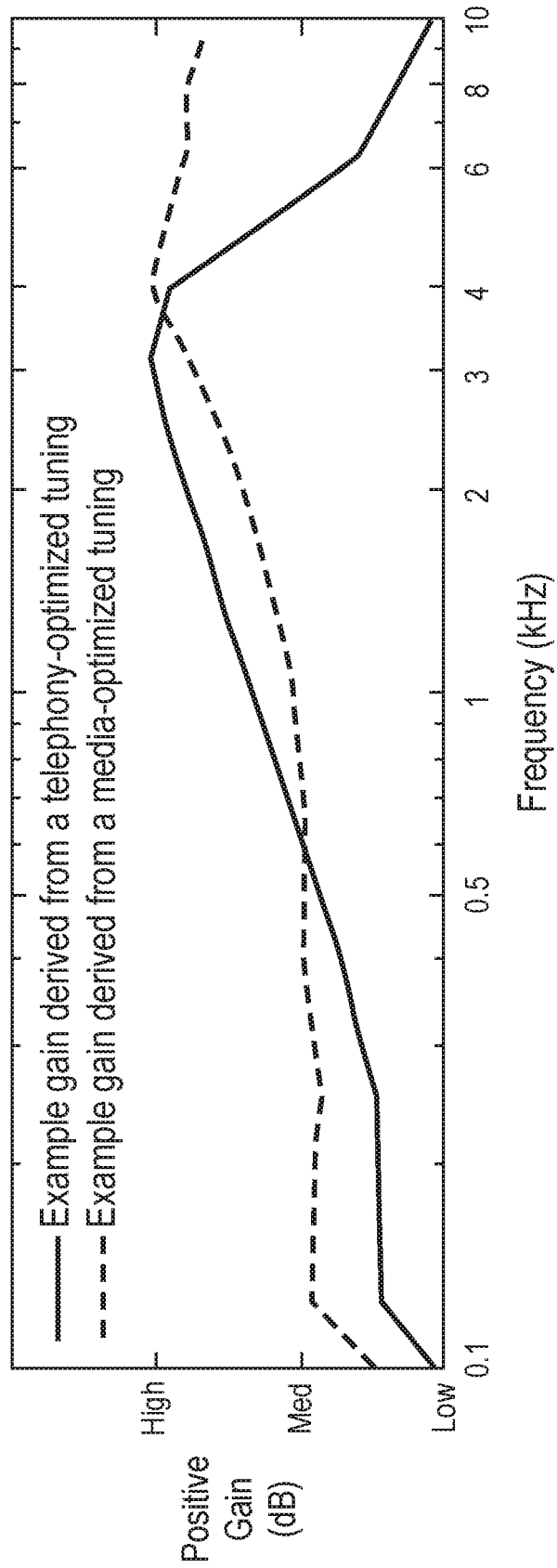
FIG. 6 illustrates some example sub-band gain curves or lookup tables.

In one aspect, different enhancement rules are applied to the user-specific hearing profile, for computing the two different gain tables. For example, as seen in the sub-band gain curves or lookup tables depicted in FIG. 6, an enhancement rule favoring speech clarity (e.g., derived from a telephony-optimized tuning) produces a gain curve that has less amplification below 500 Hz and above 8 kHz, relative to the gain curve that results from an enhancement rule designed or intended for music listening (e.g., derived from media-optimized tuning.) FIG. 6 also shows how the enhancement rule for telephony results in more amplification between 1 kHz-4 kHz, relative to the media enhancement rule. This helps prevent boosting of hiss during a phone call, where the hiss is above 6 kHz.

An enhancement rule may map a user-specific audiogram to a gain lookup table. If a user-specific audiometric testing is not available, then the enhancement rule may begin with a more generic hearing profile such as one of several common hearing loss profiles that are stored. An interactive acoustic stimulus and response process may be performed by a processor of the audio system. The process is designed to understand the user's hearing preferences, and may include different audio content types or categories such as speech and music as acoustic stimuli that are presented to the user though the speaker 2 of the against-the-ear audio device 1. The process may evaluate both verbal and manual (entered via a graphical user interface of the audio system) responses by the user that indicate how the user hears the acoustic stimuli, based on which the process will arrive at a tuning of the multiband compression gain table (sub-band gain lookup table) that is expected to be most suitable to the hearing preferences of the user.

In the process of FIG. 2, the sub-band gains are computed by a sub-band HLC gains block 20, based on a selected sub-band gain lookup table. There may be N (at least two or more) sub-band gain lookup tables stored locally or available for download, for use by the HLC gains block 20. Depending on the audio content in the input audio signal, at least one of these N sub-band gain tables is selected and provided to the HLC gains block. FIG. 2 shows an example where N=2, where if the input audio signal is telephony the sub-band gains are computed based on the determined SPL (a sub-band gain is computed based on the SPL measured for that sub-band) and using the first (telephony) gain lookup table. But when the input audio signal is media the sub-band gains are computed using the second (media) gain lookup table (and based on the determined SPL.) The sub-band gains produced by the HLC gains block 20 are then applied to the input audio signal, on a frame by frame basis, to produce output audio, for example as illustrated in FIG. 3.

Figure 3:
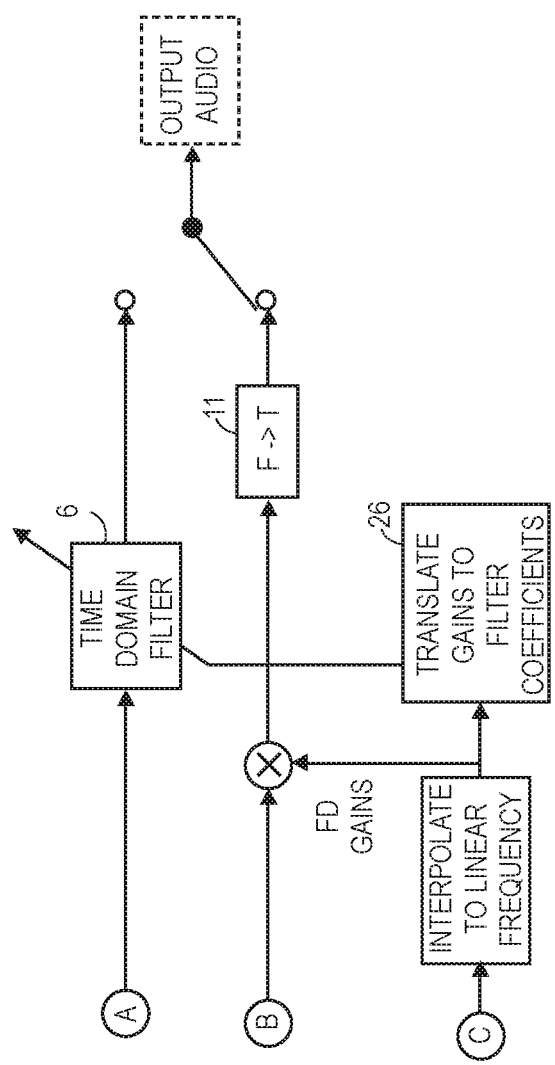
FIG. 3 shows examples of how sub-band gains for sound enhancement can be applied to the input audio signal.

In the example of FIG. 3, the sub-band gains are applied by first interpolating them from sub-band center frequencies to Fourier transform frequencies (Interpolate to Linear Frequency block), resulting in linear valued frequency domain, FD, gains that are multiplied by the input audio signal (signal spectrum), before being converted to time domain (by frequency to time domain transform 11. Alternatively, the sub-band gains are applied by translating the FD gains into digital filter coefficients (by block 26), where these filter coefficients define or configure a time domain filter 6, which is receiving and time domain filtering the input audio signal directly in the time domain (in accordance with the sub-band gains.) In either instance, output audio is produced which is then converted into sound by the against the ear audio device 1 (via its speaker 2.)

In another aspect, the compute sub-band HLC gains block 20 determines the sub-band gains by also considering SNR, so as to prevent the boosting of noise at higher frequencies, for example to avoid boosting hiss above 6 kHz. To do so, the process adds a measure auditory sub-bands block 14, which determines noise energy in the auditory sub-bands (of the input audio signal.) Next, sub-band signal to noise ratios, SNRs, are computed (sub-band SNR block 19) using the signal energy (sub-band energy) and the noise energy (sub-band noise estimate.) Thus, both sub-band SNR and sub-band SPL are used by the compute sub-band HLC gains block 20, to compute the FD gains. This aspect is useful when the input audio signal is telephony, where the computed sub-band gains above 6 kHZ are reduced in response to determining that SNR in that sub-band is below a threshold, Turning now to FIG. 4, this block diagram illustrates how clipping of the playback signal can be avoided when hearing loss compensation (personalized sound enhancement) is implemented in the audio source device 5 while signal attenuation to achieved the user's desired volume level is implemented in the against-the-ear audio device 1. The playback signal (or input audio) is to be amplified according to the hearing profile of the user and the in-ear SPL as described above, before being transmitted by a wireless digital audio communications link interface, e.g., a BLUETOOTH interface, to the against-the-ear audio device 1 for conversion into sound by the speaker 2. The amount of amplification is influenced by the user's selected volume level and may reach up to 20 dB or more, and as the input audio may be at full scale in the audio source device 5, it is necessary to create headroom before the playback signal is amplified to avoid clipping the input audio during hearing loss compensation described above in connection with FIG. 2. As a result, the against-the-ear audio device 1 requires a "remapped" volume level that accounts for the headroom applied in the audio source device 5.

To determine the headroom and remapping function, there is an against-the-ear device Volume Curve that is needed which maybe a relationship between volume level, e.g., as a percentage 0-100%, and specific attenuation in dB relative to maximum playback level. There is also the user-dependent HLC gains sub-band table. These are shown in FIG. 5. Assuming a prototype full-scale input audio signal, only the user's desired volume level will influence the amount of amplification achieved by hearing loss compensation, and from this assumption we derive the maximum possible hearing loss compensation amplification for this user, as a function of the user level volume, e.g. for the entire range of 0-100%. This is also referred to as determining the amplification upper bounds for a number of user volume levels, respectively, of a user volume range (e.g., 0-100%.) As expected and as can be seen in the example Max Gain plot in FIG. 5, the maximum gain at the lowest low volume levels is high and then monotonically decreases to its lowest value at the highest volume level, 100%. The maximum possible gain specifies the headroom needed on the audio source device 5 as a function of volume level (volume %). Based on the headroom attenuation being applied for a given volume level we can determine a "remapped" (higher) volume level to use in the against-the-ear audio device 1 (to be applied to the input audio that is received from the audio source device 5) that accounts for this already-applied headroom attenuation, as shown in the Volume Remapping plot at the upper-left of FIG. 5. In other words, the user volume range has been mapped into a remapped volume range, the volume remapper block shown in FIG. 4.

During processing of an input audio signal in the audio source device 5 (for its transmission to the against-the-ear audio device 1 where it will be converted into sound by the speaker 2), the user's desired volume is received as input to the volume remapper block, which specifies the amount of headroom attenuation needed to be applied to the input audio in the audio source device 5 (ahead of the personalized playback enhancement block which will apply hearing loss compensation gain as described above in connection with FIG. 2 and FIG. 3.) The volume remapper also specifies a new, remapped volume level that is to be sent to the against-the-ear audio device 1. The received, remapped volume level is then applied locally in the against-the-ear audio device 1, upon the received, output audio (which was pre-attenuated before the personalized playback enhancement block) to produce audio with headroom. In other words, the volume re-mapper is accessed with a present, user volume step (the present volume click set by the user) at which the input audio signal is to be played back, to obtain a present remapped volume step. The headroom attenuation block becomes configured to "pre-attenuate" the input audio signal in accordance with the amplification upper bound that corresponds to the present user volume step. This is followed with amplifying the attenuated playback signal in accordance with the user-specific sub-band gain lookup table. That amplification, namely by the personalized playback enhancement block to achieve hearing loss compensation for the user, may encompass the sequence shown in FIG. 2 beginning with the time to frequency transform 9 and ending with the frequency to time transform 11 in FIG. 3. The output audio (amplified playback signal) is then transmitted along with a message referring to the present, remapped volume step, to the against-the-ear audio device 1, e.g., via a BLUETOOTH link. There, the amplified playback signal is received along with the message referring to the present, remapped volume step, and the received signal is then attenuated in accordance with an attenuation level obtained by applying the remapped volume step to a predetermined relationship between the remapped volume range and an attenuation range (e.g., the volume curve shown in the upper right of FIG. 5.) This avoids clipping of the output audio when it is then converted into sound by the speaker 2 (in the against the ear audio device 1.)

As described above, one aspect of the present technology is the gathering and use of data available from specific and legitimate sources to improve the hearing. The present disclosure contemplates that in some instances, this gathered data may include personal information data that uniquely identifies or can be used to identify a specific person. Such personal information data can include demographic data, location-based data, online identifiers, telephone numbers, email addresses, home addresses, data or records relating to a user's health or level of fitness (e.g., vital signs measurements, medication information, and exercise information), date of birth, or any other personal information.

The present disclosure recognizes that the use of such personal information data, in the present technology, can be used to the benefit of users. For example, the personal information data can be used to improve hearing in accordance with their preferences.

The present disclosure contemplates that those entities responsible for the collection, analysis, disclosure, transfer, storage, or other use of such personal information data will comply with well-established privacy policies and/or privacy practices. In particular, such entities would be expected to implement and consistently apply privacy practices that are generally recognized as meeting or exceeding industry or governmental requirements for maintaining the privacy of users. Such information regarding the use of personal data should be prominent and easily accessible by users, and should be updated as the collection and/or use of data changes. Personal information from users should be collected for legitimate uses only. Further, such collection/sharing should occur only after receiving the consent of the users or other legitimate basis specified in applicable law. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations that may serve to impose a higher standard. For instance, in the US, collection of or access to certain health data may be governed by federal and/or state laws, such as the Health Insurance Portability and Accountability Act (HIPAA); whereas health data in other countries may be subject to other regulations and policies and should be handled accordingly.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, the present technology can be configured to allow users to select to "opt in" or "opt out" of the sound enhancement processing.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing identifiers, controlling the amount or specificity of data stored (e.g., collecting location data at city level rather than at an address level), controlling how data is stored (e.g., aggregating data across users), and/or other methods such as differential privacy.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data.

While certain aspects have been described and shown in the accompanying drawings, it is to be understood that such are merely illustrative of and not restrictive on the broad invention, and that the invention is not limited to the specific constructions and arrangements shown and described, since various other modifications may occur to those of ordinary skill in the art. The description is thus to be regarded as illustrative instead of limiting.

What is claimed is:

1. An audio signal processing method for sound enhancement by an against the ear audio device, the method comprising:
   a) determining signal energy in a plurality of auditory sub-bands of an input audio signal;
   b) determining sound pressure level, SPL, in the plurality of auditory sub-bands based on the signal energy and based on sound output sensitivity of the against-the-ear audio device;
   c) computing a plurality of gain lookup tables, based on a hearing profile of a user of the against-the-ear audio device, wherein each gain lookup table outputs gain as a function of in-ear sound pressure level, SPL, in a sub-band; and
   d) computing a plurality of sub-band gains that are to be applied to the input audio signal, wherein the plurality of sub-band gains is computed based on the determined SPL and using a selected one of the plurality of gain lookup tables that is selected based on audio content of the input audio signal.

2. The method of claim 1 wherein the plurality of gain lookup tables includes a first gain lookup table and a second gain lookup table, and wherein when the input audio signal is telephony the first gain lookup table is selected, and when the input audio signal is media the second gain lookup table is selected.

3. The method of claim 2 wherein telephony comprises voice of a far end user in a phone call, and media comprises music or a movie soundtrack.

4. The method of claim 3 wherein the plurality of sub-band gains comprises a sub-band below 500 Hz and a sub-band above 8 kHz.

5. The method of claim 3 wherein computing the first gain lookup table and the second gain lookup table comprises:
   applying a first enhancement rule to the hearing profile of the user; and
   applying a second enhancement rule to the hearing profile of the user, wherein applying the enhancement rules results in the first gain lookup table having i) more gain in 1 kHz-4 kHz and ii) less gain below 250 Hz and above 6 kHz, as compared to the second gain lookup table.

6. The method of claim 3 further comprising
   applying the plurality of sub-band gains to the input audio signal to produce output audio; and
   converting the output audio into sound by the against the ear audio device.

7. The method of claim 1 further comprising
   a) determining noise energy in the plurality of auditory sub-bands of the input audio signal; and
   b) determining a plurality of sub-band signal to noise ratios, SNRs, using the signal energy and the noise energy, and wherein computing the plurality of sub-band gains is further based on the plurality of sub-band SNRs.

8. The method of claim 7 wherein computing the plurality of sub-band gains based on the plurality of sub-band SNRs comprises reducing gain of a sub-band that is above 6 kHz in response to determining that the SNR in that sub-band is below a threshold.

9. The method of claim 1 wherein the input audio signal comprises ambient sound pickup, the method further comprising
   time domain filtering the input audio signal in accordance with the plurality of sub-band gains to produce output audio; and
   converting the output audio into sound by the against-the-ear audio device.

10. The method of claim 1 wherein computing a first gain lookup table and a second gain lookup table comprises:
    applying a first enhancement rule to the hearing profile of the user; and
    applying a second enhancement rule to the hearing profile of the user, wherein applying the enhancement rules results in the first gain lookup table having i) more gain in 1 kHz-4 kHz and ii) less gain below 250 Hz and above 6 kHz, as compared to the second gain lookup table.

11. The method of claim 1 further comprising
    applying the plurality of sub-band gains to the input audio signal to produce output audio; and
    converting the output audio into sound by the against the ear audio device.

12. An audio signal processing system for sound enhancement by an against the ear audio device, the system comprising:
    a processor; and
    memory having stored therein instructions that configure the processor to
      determine signal energy in a plurality of auditory sub-bands of an input audio signal,
      determine sound pressure level, SPL, in the plurality of auditory sub-bands based on the signal energy and based on sound output sensitivity of the against-the-ear audio device,
      determine a plurality of gain lookup tables, based on a hearing profile of a user of the against-the-ear audio device, wherein each gain lookup table outputs gain as a function of in-ear sound pressure level, SPL, in a sub-band, and
      determine a plurality of sub-band gains that are to be applied to the input audio signal, based on the determined SPL and using a selected one of the plurality of gain lookup tables that is selected based on audio content of the input audio signal.

13. The system of claim 12 wherein the plurality of gain lookup tables includes a first gain lookup table and a second gain lookup table, and wherein when the input audio signal is telephony the first gain lookup table is selected, and when the input audio signal is media the second gain lookup table is selected.

14. The system of claim 13 wherein telephony comprises voice of a far end user in a phone call, and media comprises music or a movie soundtrack.

15. The system of claim 13 wherein to determine the first gain lookup table and the second gain lookup table the processor
    applies a first enhancement rule to the hearing profile of the user, and
    applies a second enhancement rule to the hearing profile of the user, wherein applying the enhancement rules results in the first gain lookup table having i) more gain in 1 kHz-4 kHz and ii) less gain below 250 Hz and above 6 kHz, as compared to the second gain lookup table.

16. The system of claim 13 further comprising
applying the plurality of sub-band gains to the input audio signal to produce output audio; and
converting the output audio into sound by the against the ear audio device.

17. The system of claim 12 wherein the processor and memory are integrated in a housing of a headphone.

18. A computer readable storage medium comprising instructions stored therein that configure a processor to:
determine signal energy in a plurality of auditory sub-bands of an input audio signal,
determine sound pressure level, SPL, in the plurality of auditory sub-bands based on the signal energy and based on sound output sensitivity of an against-the-ear audio device,
determine a plurality of gain lookup tables, based on a hearing profile of a user of the against-the-ear audio device, wherein each gain lookup table outputs gain as a function of in-ear sound pressure level, SPL, in a sub-band, and
determine a plurality of sub-band gains that are to be applied to the input audio signal, based on the determined SPL and using a selected one of the plurality of gain lookup tables that is selected based on audio content of the input audio signal.

19. The computer readable storage medium of claim 18 wherein the plurality of gain lookup tables includes a first gain lookup table and a second gain lookup table, and wherein when the input audio signal is telephony the first gain lookup table is selected, and when the input audio signal is media the second gain lookup table is selected.

20. The computer readable storage medium of claim 19 wherein telephony comprises voice of a far end user in a phone call, and media comprises music or a movie soundtrack.

21. The computer readable storage medium of claim 19 further comprising
applying the plurality of sub-band gains to the input audio signal to produce output audio; and
converting the output audio into sound by the against the ear audio device.

* * * * *